(12) United States Patent
Fu et al.

(10) Patent No.: US 6,596,576 B2
(45) Date of Patent: Jul. 22, 2003

(54) LIMITING HYDROGEN ION DIFFUSION USING MULTIPLE LAYERS OF $SIO_2$ AND $SI_3N_4$

(75) Inventors: Tzy-Tzan Fu, Hsinchu (TW); Kuan-Ting Lin, Keelung (TW); Chao-Sheng Chou, Hsinchu (TW)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/032,359

(22) Filed: Dec. 21, 2001

(65) Prior Publication Data

US 2002/0146879 A1 Oct. 10, 2002

(30) Foreign Application Priority Data

Apr. 10, 2001 (TW) .......................................... 090108587

(51) Int. Cl.[7] .......................................... H01L 21/8238
(52) U.S. Cl. ....................................................... 438/230
(58) Field of Search .............................. 438/230, 231, 438/696, 699, 791, 792

(56) References Cited

U.S. PATENT DOCUMENTS

| | | | |
|---|---|---|---|
| 5,382,540 A | * 1/1995 | Sharma et al. ............... 438/259 |
| 5,880,006 A | * 3/1999 | Lin et al. ..................... 438/424 |
| 5,899,752 A | 5/1999 | Hey et al. .................... 438/791 |
| 6,127,287 A | 10/2000 | Hurley et al. ................ 438/791 |
| 6,133,124 A | * 10/2000 | Horstmann et al. .......... 438/525 |
| 6,221,794 B1 | 4/2001 | Pangrle et al. ............... 438/792 |
| 6,268,257 B1 | * 7/2001 | Wieczorek et al. .......... 438/305 |
| 6,309,948 B1 | * 10/2001 | Lin et al. ..................... 438/424 |

* cited by examiner

*Primary Examiner*—David Nelms
*Assistant Examiner*—Thao P Le
(74) *Attorney, Agent, or Firm*—Janah & Associates

(57) ABSTRACT

A method of fabricating a semiconductor device having a gate structure comprising $SiO_2$ and $Si_3N_4$ that exhibits reduced hydrogen diffusion during low temperature chemical vapor deposition of silicon nitride. In the method, a silicon dioxide ($SiO_2$) layer is deposited on a wafer after a gate structure is fabricated. A barrier layer is formed on the silicon dioxide ($SiO_2$) layer. Then a silicon nitride layer is formed over it by low temperature chemical vapor deposition. The barrier layer reduces, and may even altogether prevent, diffusion of the hydrogen absorbed by the silicon nitride layer into the gate oxide and channel during the low temperature chemical vapor deposition of silicon nitride.

18 Claims, 8 Drawing Sheets

LIMITING HYDROGEN ION DIFFUSION USING MULTIPLE LAYERS OF SIO₂ AND SI₃N₄

BACKGROUND

The present invention relates to a method of forming gate structures comprising $SiO_2$ and $Si_3N_4$ in the fabrication of semiconductors.

Electrical products with increased functionality require more storage and memory for performing the additional functions. Typically, conventional memories are composed of a MOS (Metal-Oxide-Semiconductor) transistor and capacitor, in which the MOS transistor generally comprises a source, drain, and gate. The gate is usually called a gate structure because the gate comprises layers of different materials, such as dielectric, metal and spacer layers. The spacer layers of the gate structure are applied as masks when forming a lightly doped drain (LDD) layer under the gate structure and positioned between the source and drain. The LDD layer is used to prevent the operations of the MOS transistor from interfering by the short channel or hot electron effects. In addition, the spacer layers are usually made of silicon nitride. Anisotropic etching is used to form the spacer layer that may result in increased leakage current.

FIG. 1 represents a typical gate structure comprising a gate oxide layer 101, a polysilicon layer 102, and a spacer layer 103, which may be a silicon nitride cap layer, that are sequentially formed on a wafer to form the gate structure. In one version, the spacer layer is composed of a silicon oxide layer and a silicon nitride layer, such that the silicon oxide layer reduces stresses on the silicon nitride layer to prevent stripping of the layer. For example, FIG. 2 shows a spacer layer, in which the thickness of silicon oxide layer 201 is in the range of 200 to 300 angstroms and the thickness of silicon nitride layer 202 is in the range of 400 to 800 angstroms, and this kind of the structure comprising $SiO_2$ and $Si_3N_4$ layers is used in certain types of integrated circuits. For example, the $E^2PROM$ and Flash often use an ONO structure to serve as a dielectric layer between the floating gate and the control gate, where the "O" means the $SiO_2$ layer and the "N" means the $Si_3N_4$ layer. This application utilizes the high dielectric constant of the $Si_3N_4$ layer.

Typically, the $SiO_2/Si_3N_4$ layers are manufactured by low pressure chemical vapor deposition processes (LPCVD). In such LPCVD methods, a nitrogen-contained gas is reacted with a silicon-containing gas to deposit silicon-nitride on the substrate. Typically, the silicon-containing gas comes from the gas source, such as $SiH_2Cl_2$, $Si_2H_6$ or $SiH_4$; and the nitrogen-contained gas comes from ammonia ($NH_3$). When $SiH_2Cl_2$ and $NH_3$ gas are used as reaction gases in a LPCVD process, the chemical reaction is as follows:

$3SiH_2Cl_{2(g)} + 7NH_{3(g)} \ldots Si_3N_{4(s)}$ $+ 3NH_4Cl_{(s)} + 3HCl_{(g)} + 6H_{2(g)}$ $3SiH_{4(g)} + 4NH_{3(g)} \ldots Si_3N_{4(s)} + 12H_{2(g)}$ In semiconductor device manufacturing, the conductivity of a semiconductor material may be controlled by doping the semiconductor material with a dopant. The dopant source concentration and distribution affect the performance of the semiconductor devices. At high temperatures, thermal diffusion can cause the dopant region to expand or shift, thereby reducing the concentration of dopant in a dopant region. Extensive thermal diffusion can also cause the dopant region to close or overlap each other causing short channel and punch-through effects. The hydrogen produced when forming a silicon nitride layer by LPCVD may easily be adsorbed by the silicon nitride layer to act like a dopant material. At high temperatures, the hydrogen diffuses into the gate oxide and channel causing a threshold voltage shift of the MOS transistor.

Thus, it is desirable to have a structure of $SiO_2/Si_3N_4$ layers that reduces hydrogen atom diffusion into the gate oxide and channel to reduce any resultant degradation of the MOS transistor. However, with conventional methods of forming the $SiO_2/Si_3N_4$ layers it is difficult to control the adverse electrical effects that arise from impurity diffusion. Also, conventional methods have difficulty in solving pin-holing problems. It is desirable to have a method of manufacturing the $SiO_2/Si_3N_4$ layers to reduce adverse electrical effects arising from impurity diffusion especially for manufacturing highly integrated sub-micron semiconductor processes and to also reduce pin-holing effects.

SUMMARY

A method for fabricating a semiconductor device having a gate structure comprising $SiO_2$ and $Si_3N_4$ comprises defining an active region on a substrate, forming an oxide layer on the substrate, forming a polysilicon layer on said oxide layer, forming a silicide layer on said polysilicon layer, defining the gate structure by etching the oxide layer, the polysilicon layer and the suicide layer, and implanting ions into the substrate using the gate structure as a mask. The method further comprises depositing a first deposition layer on the substrate, positioning the substrate in a reaction chamber, providing in the reaction chamber, an energized gas comprising a nitrogen component that reacts with a portion of the first deposition layer to form a silicon oxynitride layer on the first deposition layer, depositing a second deposition layer on the silicon oxynitride layer, and etching the first and second deposition layers and the silicon oxynitride layer to form multiple spacer layers against the gate structure.

A method for fabricating a semiconductor device having a gate structure comprising $SiO_2$ and $Si_3N_4$ comprises defining an active region on a substrate, forming an oxide layer on the substrate, forming a polysilicon layer on the oxide layer, forming a silicide layer on the polysilicon layer, defining said gate structure by etching the oxide layer, the polysilicon layer and the silicide layer, and implanting ions into the substrate by using the gate structure as a mask. The method further comprises forming a first deposition layer on the substrate, forming a second deposition layer on the first deposition layer, positioning the substrate having the first deposition layer and the second deposition layer in a reaction chamber, performing an annealing process, forming a third deposition layer on the second deposition layer, and etching the plurality of deposition layers to form multiple spacer layers against the gate structure.

A method for fabricating a semiconductor device having a gate structure comprising $SiO_2$ and $Si_3N_4$ comprises defining an active region on a substrate, forming an oxide layer on the substrate, forming a polysilicon layer on the oxide layer, forming a suicide layer on the polysilicon layer, defining the gate structure by etching the oxide layer, the polysilicon layer and the suicide layer, and implanting ions into the substrate by using the gate structure as a mask. The method further comprises forming a first deposition layer on the wafer, forming a second deposition layer on the first deposition layer, forming a third deposition layer on the second deposition layer, and etching the first, second and third of deposition layers to form multiple spacer layers against the gate structure.

DRAWINGS

The foregoing aspects and the attendant advantages of this invention will be more readily appreciated as the same becomes better understood by reference to the following detailed description of illustrative examples of the present invention, in conjunction with the accompanying drawings, wherein.

DESCRIPTION

Without limiting the spirit and scope of the present invention, a method according to the present invention is illustrated with reference to an embodiment relating to method of forming a barrier layer in the $SiO_2/Si_3N_4$ structure. The barrier layer is capable reducing diffusion of the H atoms absorbed by a silicon nitride ($Si_3N_4$) layer into gate oxide and thereby reducing formation of electrical shorts and other such adverse effects in the MOS transistor in the deposition of silicon nitride ($Si_3N_4$) by low temperature chemical vapor deposition processes. However, one of ordinary skill in the art can also apply the present invention for forming a barrier layer on other types of the $SiO_2/Si_3N_4$ structures to reduce impurity absorption by silicon nitride ($Si_3N_4$) layer and diffusion of the impurities into the gate oxide or channel.

In one embodiment, a $SiO_2/Si_3N_4$ gate spacer structure is formed. In this method, a silicon dioxide ($SiO_2$) layer is deposited on a wafer after a gate structure is fabricated therein. A barrier layer is formed on the silicon dioxide ($SiO_2$) layer. Then a silicon nitride ($Si_3N_4$) layer is formed over it by low temperature chemical vapor deposition. It is believed that this barrier layer is capable of preventing diffusion of the H atom absorbed in the silicon nitride ($Si_3N_4$) layer into the gate oxide and channel that causes adverse electrical effects in the MOS transistor during the silicon nitride ($Si_3N_4$) deposition low temperature chemical vapor deposition processes.

Figure 1:
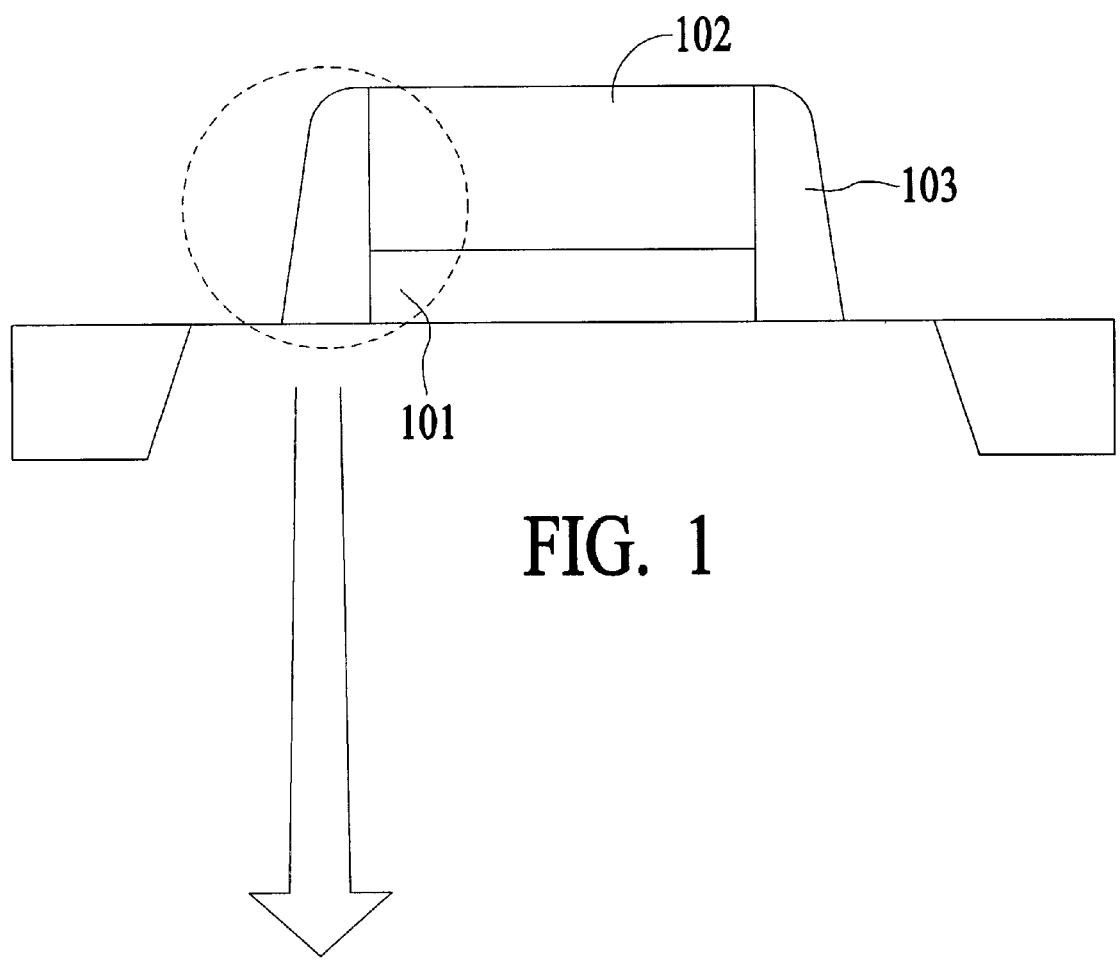
FIG. 1 is a schematic cross-sectional diagram of a MOS transistor gate structure.
Figure 2:
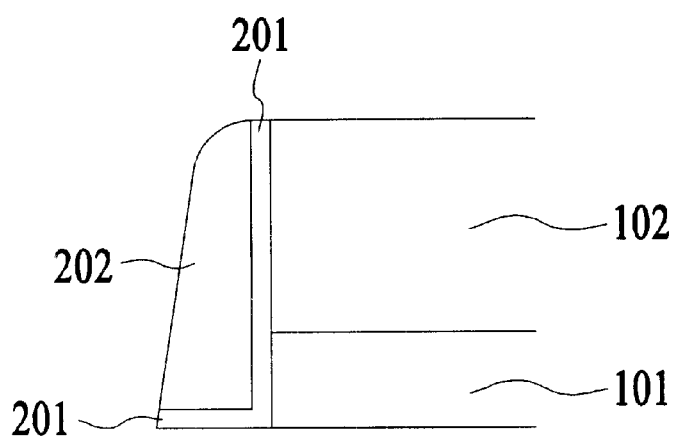
FIG. 2 is a schematic cross-sectional diagram of the spacer layer of the MOS transistor shown in FIG. 1.
Figure 3:
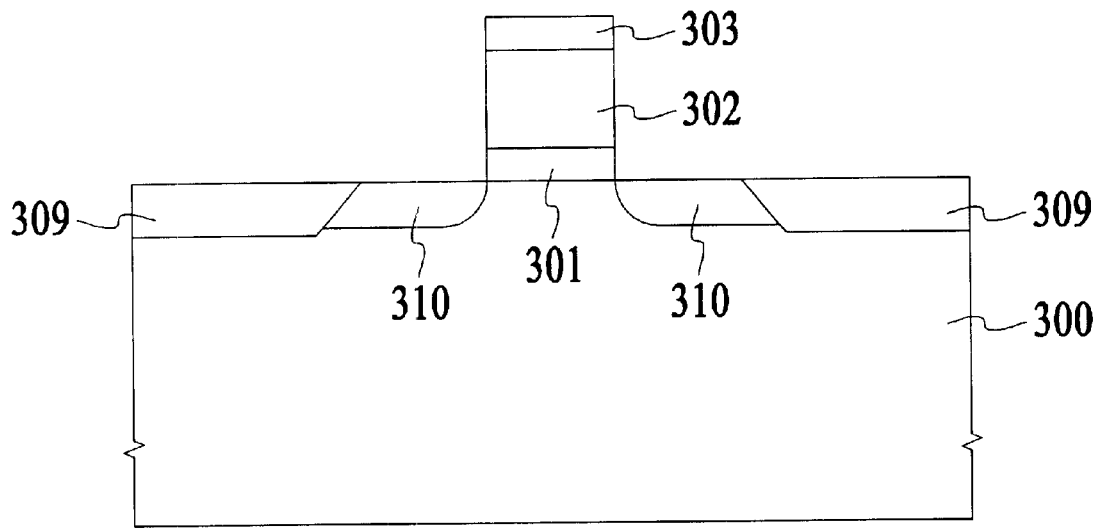
FIG. 3 is a schematic cross sectional diagram according to a first preferred embodiment of the present invention showing a gate oxide layer, a polysilicon layer and a silicide layer, that are sequentially formed and defined on a wafer.

FIGS. 3–8 depicts a first embodiment of the invention. For simplicity, the processes and structures for forming the capacitor of the MOS transistor will not be discussed, but these may be formed by conventional methods as would be apparent to one of ordinary skill in the art. At first, an active region is defined in a wafer 300. Next, a gate oxide layer 301, a polysilicon layer 302 and silicide layer 303 are formed. As noted, an isolation region 309 is used to separate two of the active regions. The gate structure is sequentially formed and defined on the wafer 300. The structure defining processes may be achieved by anisotropic etching using an etchant after a photoresist layer (not shown) is patterned as a mask. The conventional LDD layer 310 is then formed in the wafer 300 by an ion implementation process. FIG. 3 illustrates a cross-sectional diagram of the aforementioned layers as they are formed and defined on the wafer 300.

Figure 4:
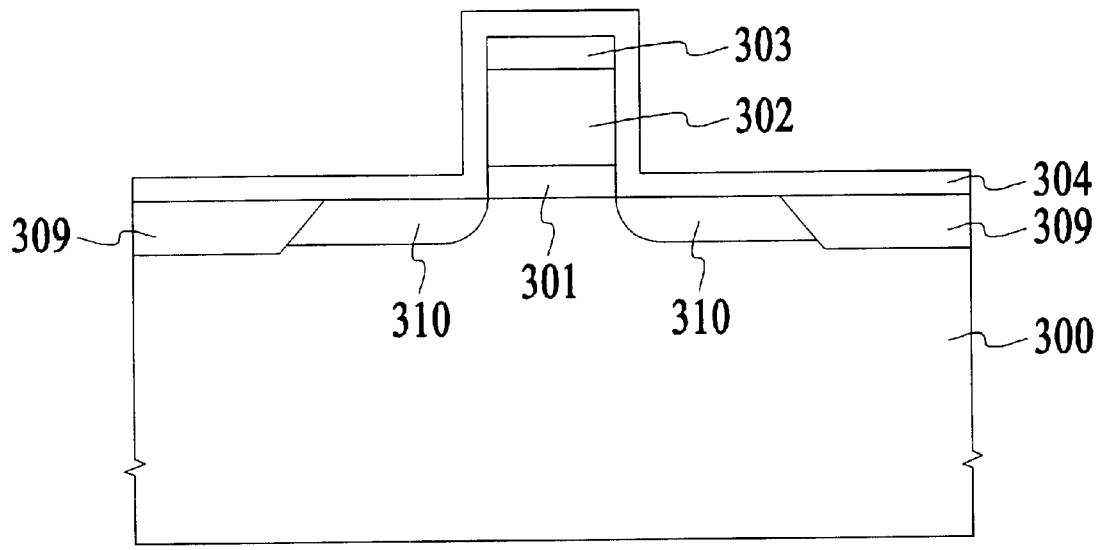
FIG. 4 is a schematic cross sectional diagram showing a silicon oxide layer formed on the wafer shown in the FIG. 3
Figure 5:
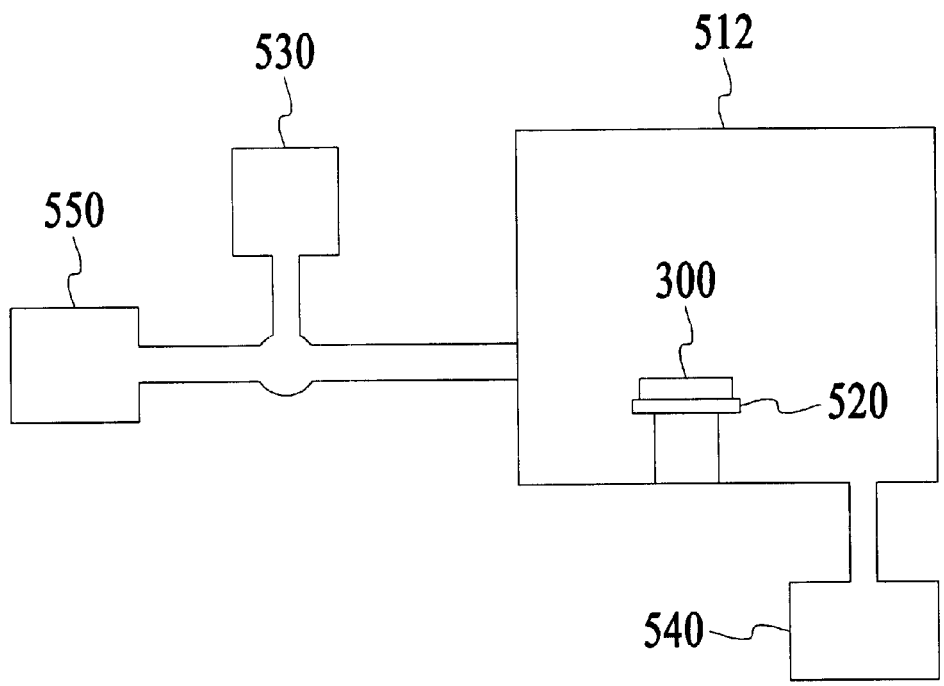
FIG. 5 is a schematic diagram of a reaction chamber according to the present invention.
Figure 6:
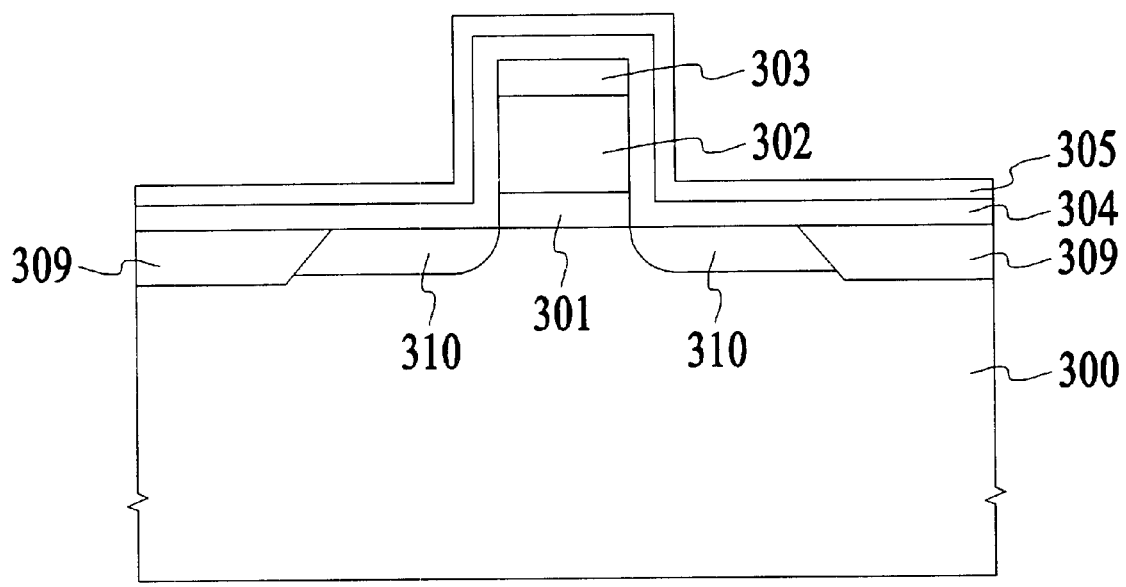
FIG. 6 is schematic cross-sectional diagram showing a $SiO_xN_y$ layer formed on the wafer shown in FIG. 4.

FIG. 4 shows a first deposition layer 304 deposited on the wafer 300 of FIG. 3, in which the first deposition layer 304 may be silicon oxide. Referring to FIG. 5 the semiconductor wafer 300 after deposition of the first layer 304 is placed on a base 520 in a reaction chamber 512 before the plasma process. Nitrogen ion or neutral species can be generated in a remote plasma cavity 550 or in-situ in a process chamber 512. The plasma may be generated by RF energy or microwaves. The process gas may include nitrogen, and may also include He or Ar as a diluent gas to control the nitridation process. In one version, the nitrogen-contained plasma concentration ranges from about 5% to about 90%. The nitrogen-contained plasma is transferred to the reaction chamber 512 by the pump system 540, and the wafer 300 is heated to predefined temperatures by a heating apparatus (not shown) to increase the diffusion rate of N ions or neutrals into the silicon oxide layer. The N ions or neutrals are adsorbed on the surface of the silicon oxide layer and then diffuses into the layer to form a $SiO_xN_y$ layer. The wafer 300 is maintained at temperatures in the range of about room temperature to about 750° C. and more preferable at about 550° C. The processing time of forming the $SiO_xN_y$ layer is in the range of from about 50 seconds to about 360 seconds and more preferably, at about 100 seconds. The thickness of the $SiO_xN_y$ layer that may be formed is from about 10 angstroms to about 50 angstroms. FIG. 6 shows a $SiO_xN_y$ layer 305 formed on the semiconductor wafer 300. The $SiO_xN_y$ layer 305 reduces and may altogether prevent the diffusion of the H atom adsorbed on the silicon nitride layer during subsequent low pressure chemical vapor deposition processes.

Figure 7:
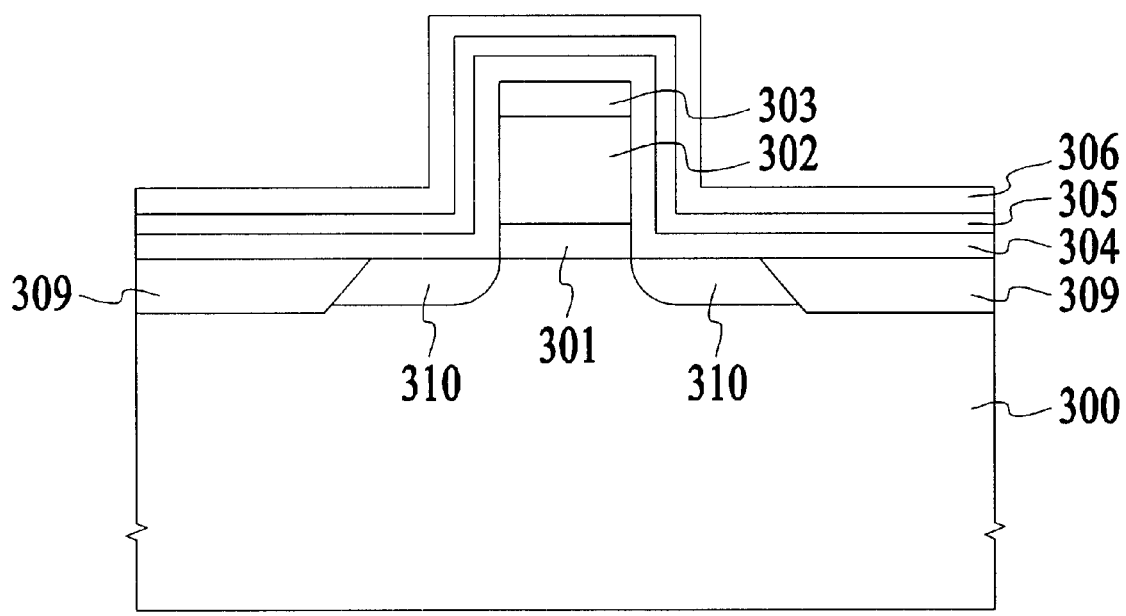
FIG. 7 is a schematic cross-sectional diagram showing a silicon nitride layer formed on the wafer shown in the FIG. 6.
Figure 8:
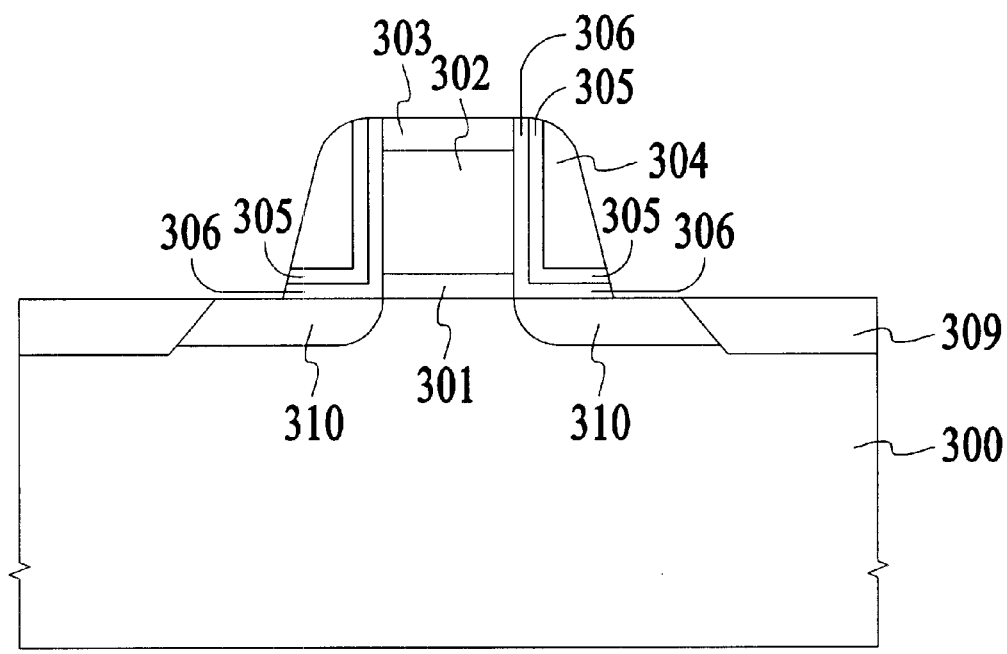
FIG. 8 is a schematic cross-sectional diagram showing anisotropic etching of the silicon oxide/$SiO_xN_y$/silicon nitride layers to form spacer layers against the sidewall of the gate structure of the wafer of the FIG. 7.
Figure 9:
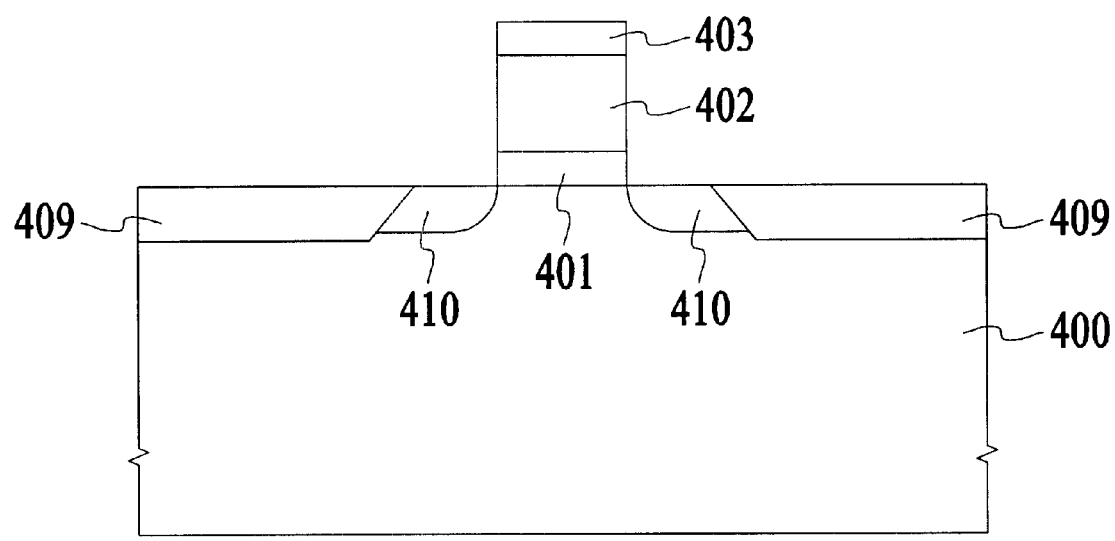
FIG. 9 is a schematic cross-sectional diagram according to a second preferred embodiment of the present invention showing a gate oxide layer, a polysilicon layer and a silicide layer, that are sequentially formed and defined on a wafer.

FIG. 7 shows a silicon nitride layer formed on the semiconductor wafer of FIG. 6 by a low pressure chemical vapor deposition (LPCVD) method uses that a nitrogen-contained gas to react with a silicon-contained gas to form silicon nitride on the $SiO_xN_y$ layer 305. The silicon-containing gas comes from a gas source, such as $SiH_2Cl_2$, $Si_2H_6$ or $SiH_4$; and the nitrogen-containing gas comes from ammonia ($NH_3$). $SiH_2Cl_2$ and $NH_3$ gases are usually used as reaction gas sources in the LPCVD process. Next, an anisotropic etching process is performed on the silicon oxide/$SiO_xN_y$/silicon nitride layers to form spacer layers that lie against the sidewall of the gate structure of the semiconductor wafer 300 of FIG. 7. FIG. 8 shows a spacer layer having a barrier layer to reduce or prevent diffusion of hydrogen adsorbed in the silicon nitride into the gate oxide and channel.

Figure 10:
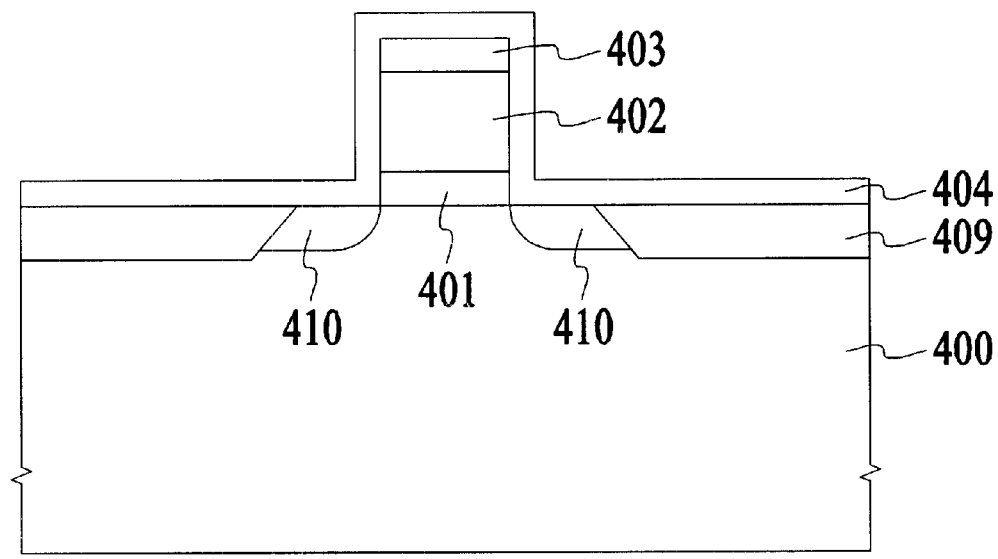
FIG. 10 is a schematic cross-sectional diagram showing a silicon oxide layer formed on the wafer shown in the FIG. 9.
Figure 11:
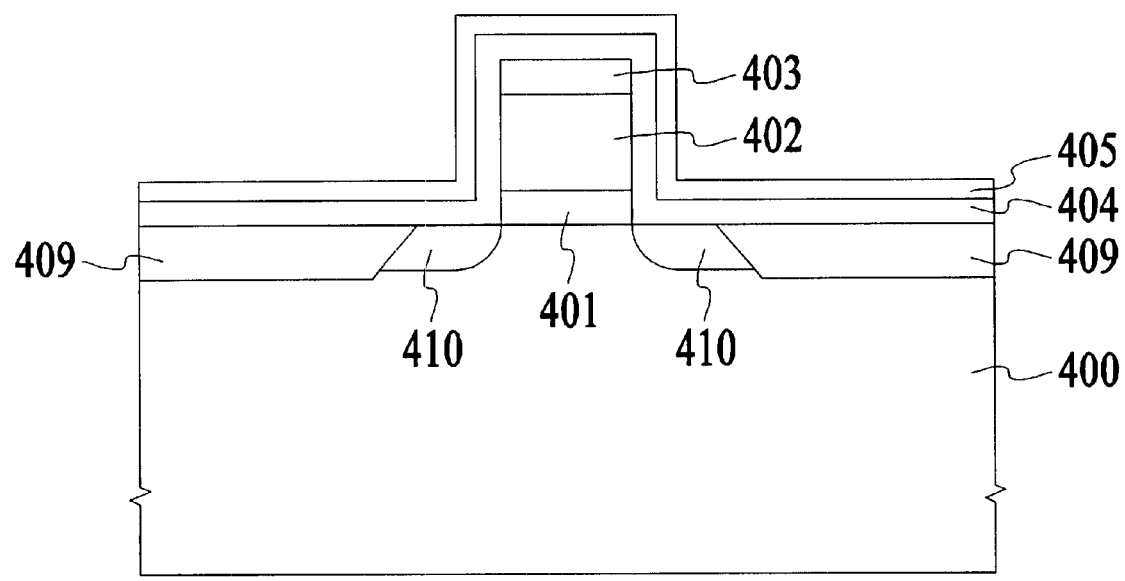
FIG. 11 is a schematic cross-sectional diagram showing a thin silicon nitride layer formed on the wafer shown in the FIG. 10 and preceding an annealing process.

FIGS. 9–12 show a second embodiment of the invention. For simplicity, the processes for forming the capacitor of the MOS transistor are not described. At first, an active region is defined in a wafer 400. Next, a gate oxide layer 401, a polysilicon layer 402 and silicide layer 403 is formed. As noted, an isolation region 409 is used to separate two of the active regions. An LDD layer 410 is then formed in the wafer 400 by an ion implementation process. FIG. 10 shows the deposition of a first deposition layer 404 comprising silicon oxide on the wafer 400 shown in the FIG. 9. Next, referring to FIG. 11, a low pressure chemical vapor deposition (LPCVD) process is performed. The LPCVD method uses a nitrogen-containing gas to react with a silicon-containing gas to form a thin silicon nitride layer on the silicon oxide layer 404, the thickness of the silicon nitride layer is typically being from about 20 angstroms to about 50 angstroms. The silicon-containing gas comes from a gas source, such as $SiH_2Cl_2$, $Si_2H_6$ or $SiH_4$; and the nitrogen-containing gas comes from ammonia ($NH_3$). An annealing process is performed on the wafer 400 to remove the hydrogen species adsorbed in the thin silicon nitride layer 405, which may reduce the concentration of the hydrogen species in the silicon nitride layer. The annealing temperature is in the range of from about 800 to about 1100° C.; and more preferably about 900° C. The annealing process time is in the range of from about 10 seconds to about 30 seconds and more preferably, about 20 seconds.

Figure 12:
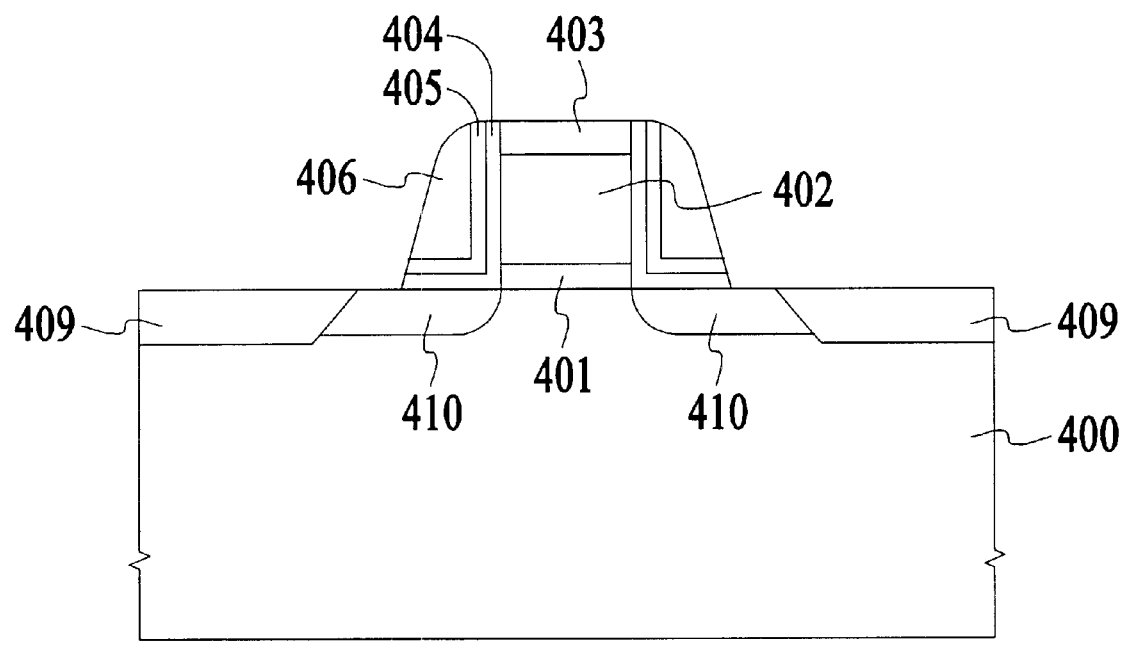
FIG. 12 is a schematic cross-sectional diagram showing a thick silicon nitride layer formed on the wafer shown in the FIG. 11 and preceding an anisotropic etching process.
Figure 13:
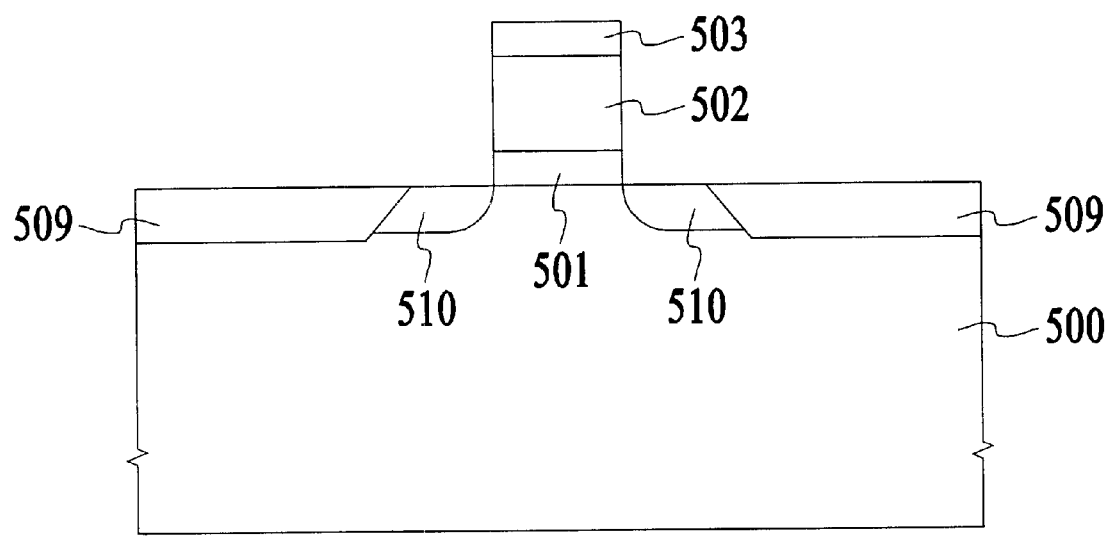
FIG. 13 is a schematic cross-sectional diagram according to a third preferred embodiment of the present invention showing a gate oxide layer, a polysilicon layer and a silicide layer, as that are sequentially formed and defined on a wafer.

Referring to FIG. 12, a low pressure chemical vapor deposition (LPCVD) process is used to form a silicon nitride layer. In the LPCVD method, a nitrogen-containing gas is reacted with a silicon-containing gas to form a thick silicon-nitride layer 406 over the thin silicon-nitride layer 405, wherein the thickness of the silicon nitride layer maybe from about 400 angstroms to about 800 angstroms. The silicon-containing gas comes from a gas source, such as $SiH_2Cl_2$, $Si_2H_6$ or $SiH_4$; and the nitrogen-containing gas comes from ammonia ($NH_3$). Although the thick silicon nitride layer 406 adsorbs hydrogen during the LPCVD process, the thin silicon nitride layer 405 serves as a barrier layer that later prevents the hydrogen from diffusing into the oxide layer and channel. Next, an anisotropic etching process is performed on the spacer layers. Then, a spacer layer having a barrier layer to prevent the hydrogen adsorbed in the silicon nitride from diffusing into the gate oxide and channel is formed.

Figure 14:
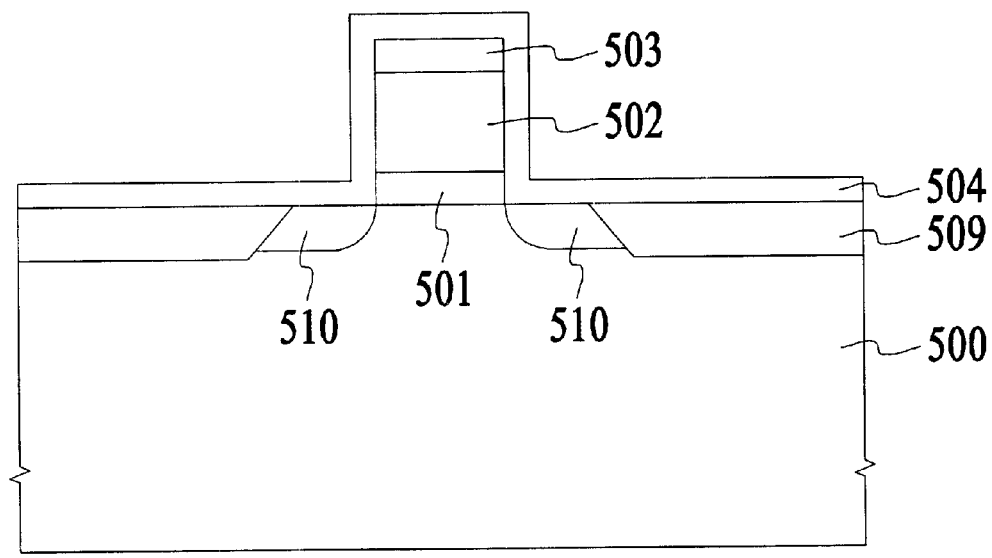
FIG. 14 is a schematic cross-sectional diagram showing a silicon oxide layer formed on the wafer of the FIG. 13.
Figure 15:
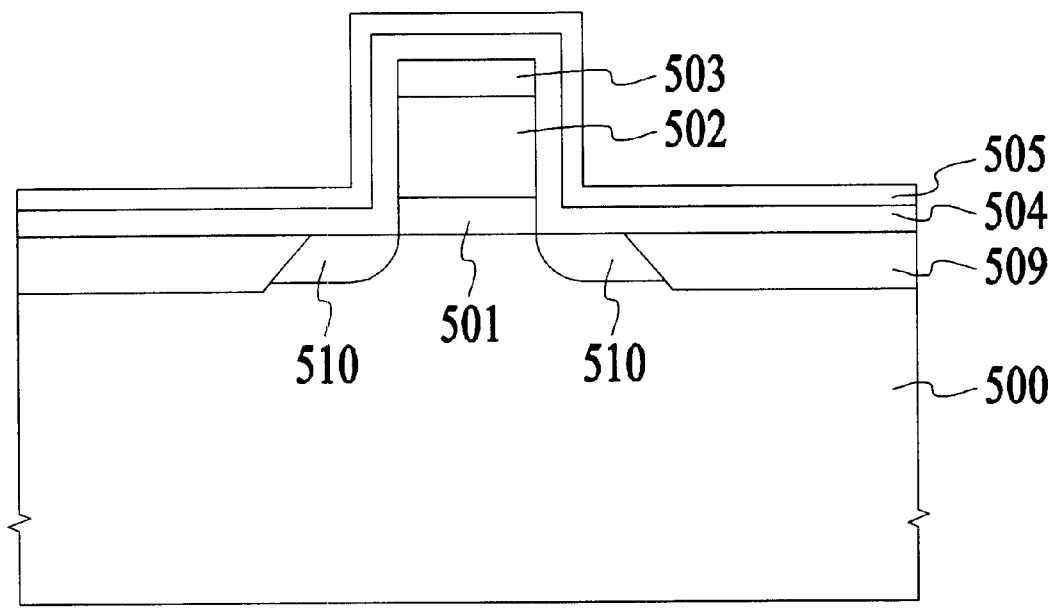
FIG. 15 is a schematic cross-sectional diagram showing a thin silicon nitride layer formed on the wafer of the FIG. 14 after an annealing process.

FIGS. 13–16 depict a third embodiment of the invention. After a capacitor of the MOS transistor is formed, an active region is defined in a wafer 500. Next, a gate oxide layer 501, a polysilicon layer 502 and silicide layer 503 are formed. An isolation region 509 is used to separate two of the active regions. The LDD layer 510 is then formed in the wafer 500 by an ion implementation process. FIG. 14 shows first deposition layer 504 comprising silicon oxide, on the wafer 500. Next referring to FIG. 14, an atomic layer deposition method is used to form a silicon nitride layer by introducing a nitrogen-containing and a silicon-containing gas are provided into the reaction chamber, in turns, so as to form a thin silicon nitride layer over the silicon oxide layer 504. When a nitrogen-contained gas is provided into the reaction chamber, a portion of the nitrogen-contained gas is chemically absorbed on the silicon oxide surface. Thereafter, the chamber is pumped out to remove the remaining nitrogen-contained gas, and then purged with inert gas. A silicon-contained gas is then introduced into the reaction chamber to react with the absorbed nitrogen-contained gas to form a silicon nitride layer 505 having a thickness of from about 20 angstroms to about 50 angstroms. The silicon-containing gas may be $SiH_2Cl_2$, $Si_2H_6$ or $SiH_4$; and the nitrogen-containing gas may be ammonia ($NH_3$). The layer can serve as a barrier layer because the atomic layer deposition method can deposit a silicon nitride layer that is substantially absent or without hydrogen.

Figure 16:
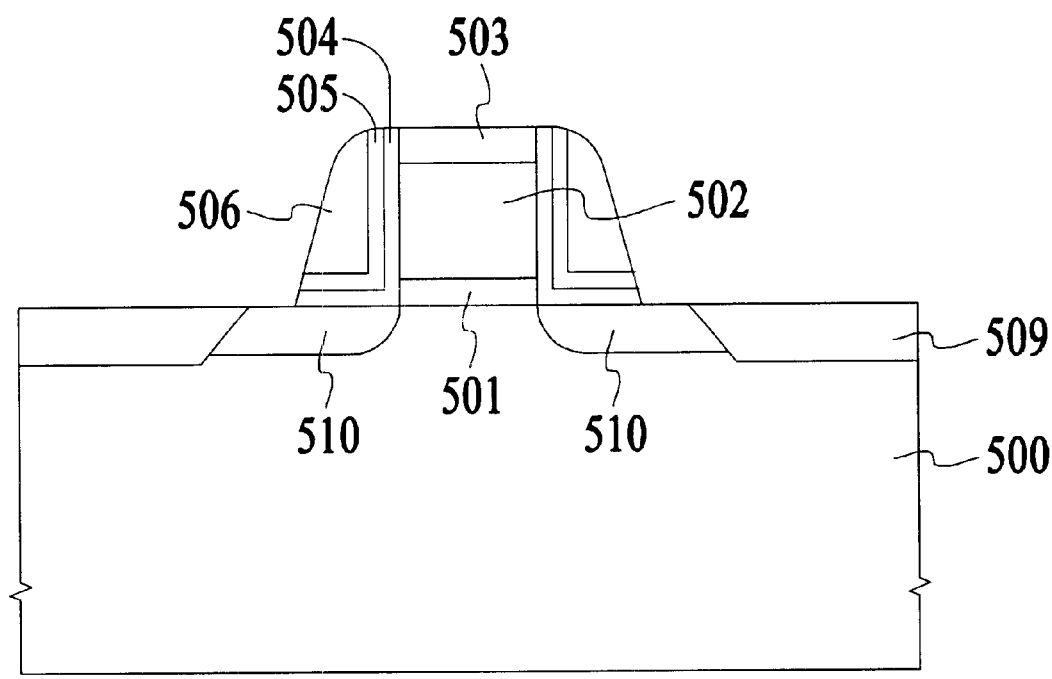
FIG. 16 is a schematic cross-sectional diagram showing a thick silicon nitride layer formed on the wafer of the FIG. 15 prior to an anisotropic etching process.

Referring to FIG. 16, an LPCVD method uses a nitrogen-containing gas to react with a silicon-containing gas to form a thick silicon-nitride layer 506 over the thin silicon nitride layer 505, the thickness of the thick silicon nitride layer being from about 400 angstroms to about 800 angstroms. The silicon-containing gas may be, for example, $SiH_2Cl_2$, $Si_2H_6$ or $SiH_4$; and the nitrogen-contained gas may be ammonia ($NH_3$). The Hydrogen is absent from the thin silicon nitride layer 505 through atomic layer deposition. Therefore, although the thick silicon nitride layer 506 adsorbs hydrogen during the LPCVD process, the thin silicon nitride layer 505 serves as a barrier layer to prevent hydrogen diffusion into the oxide layer and channel. Next, an anisotropic etching process is performed on the spacer layers. Then, a spacer layer having a barrier layer to prevent the hydrogen adsorbed in the silicon nitride from diffusing into the gate oxide and channel is formed.

Although the present invention has been described in considerable detail with regard to certain preferred versions thereof, other versions are possible. Furthermore, while the support is suitable for high temperature processes it should not be limited to such applications. Therefore, the appended claims should not be limited to the description of the preferred versions contained herein.

What is claimed is:

1. A method for fabricating a semiconductor device having a gate structure comprising $SiO_2$ and $Si_3N_4$, the method comprising:

defining an active region on a substrate;

forming an oxide layer on the substrate;

forming a polysilicon layer on said oxide layer;

forming a silicide layer on said polysilicon layer;

defining the gate structure by etching the oxide layer, the polysilicon layer and the silicide layer;

implanting ions into the substrate using the gate structure as a mask;

depositing a first deposition layer on the substrate;

positioning the substrate in a reaction chamber;

providing in the reaction chamber, an energized gas comprising a nitrogen component that reacts with a portion of the first deposition layer to form a silicon oxynitride layer on the first deposition layer;

providing in the reaction chamber, a deposition gas comprising a hydrogen containing gas to deposit a second deposition layer on the silicon oxynitride layer, wherein the diffusion of hydrogen into the oxide layer is substantially reduced by the silicon oxynitride layer; and etching the first and second deposition layers and the silicon oxynitride layer to form multiple spacer layers against the gate structure.

2. A method according to claim 1 wherein the first deposition layer is a silicon oxide layer.

3. A method according to claim 1 wherein the second deposition layer is a silicon nitride layer deposited by a low pressure chemical vapor deposition method.

4. A method according to claim 1 wherein the step of reacting the nitrogen component of the energized gas is performed for about 50 seconds to about 360 seconds.

5. A method for fabricating a semiconductor device having a gate structure comprising $SiO_2$ and $Si_3N_4$, the method comprising:

defining an active region on a substrate;

forming an oxide layer on the substrate;

forming a polysilicon layer on the oxide layer;

forming a suicide layer on the polysilicon layer;

defining said gate structure by etching the oxide layer, the polysilicon layer and the suicide layer;

implanting ions into the substrate by using the gate structure as a mask;

forming a first deposition layer on the substrate;

forming a second deposition layer on the first deposition layer;

positioning the substrate having the first deposition layer and the second deposition layer in a reaction chamber;

performing an annealing process to anneal the second deposition layer;

providing in the reaction chamber, a deposition gas comprising a hydrogen containing gas to form a third deposition layer on the annealed second deposition layer, wherein the diffusion of hydrogen into the oxide layer is substantially reduced by the annealed second deposition layer; and etching the plurality of deposition layers to form multiple spacer layers against the gate structure.

6. A method according to claim 5 wherein the first deposition layer comprises a silicon oxide layer.

7. A method according to claim 5 wherein the second deposition layer comprises a silicon nitride layer deposited by a low pressure chemical vapor deposition method.

8. A method according to claim 5 wherein the second deposition layer is formed to a thickness ranging from about 20 angstroms to about 50 angstroms.

9. A method according to claim 5 wherein the annealing process is performed at temperature of from about 800° C. to about 1000° C.

10. A method according to claim 5, wherein the annealing process is performed for from 10 seconds to 30 seconds.

11. The method according to claim 5, wherein the third deposition layer comprises a silicon nitride layer deposited by a low pressure chemical vapor deposition method.

12. A method for fabricating a semiconductor device having a gate structure comprising $SiO_2$ and $Si_3N_4$, the method comprising:

defining an active region on a substrate;

forming an oxide layer on the substrate;

forming a polysilicon layer on the oxide layer;

forming a suicide layer on the polysilicon layer;

defining the gate structure by etching the oxide layer, the polysilicon layer and the suicide layer;

implanting ions into the substrate by using the gate structure as a mask;

forming a first deposition layer on the wafer;

forming a second deposition layer on the first deposition layer, the second deposition layer being adapted to substantially reduce the diffusion of hydrogen therethrough;

providing a deposition gas comprising a hydrogen containing gas to form a third deposition layer on the second deposition layer; and etching the first, second and third deposition layers to form multiple spacer layers against the gate structure.

13. A method according to claim 12 wherein the first deposition layer comprises a silicon oxide layer.

14. A method according to claim 12 wherein the second deposition layer comprises a silicon nitride layer deposited by a low pressure chemical vapor deposition method.

15. A method according to claim 12 wherein the step of forming a second deposition layer on said first deposition layer, comprises (a) providing the substrate having said first deposition layer in a reaction chamber;

(b) delivering a nitrogen-containing gas into said reaction chamber, whereby a portion of the nitrogen-containing gas will be chemically absorbed on the surface of the first deposition layer;

(c) pumping out said reaction chamber to remove the remaining nitrogen-containing gas; and (d) delivering a silicon-containing gas into the reaction chamber, whereby a chemical reaction occurs between the absorbed nitrogen-containing gas and the silicon-containing gas to form a silicon nitride layer on the surface of the first deposition layer.

16. A method according to claim 15 wherein the second deposition layer comprises a thickness in the range of from about 20 angstroms to about 50 angstroms.

17. The method according to claim 15, wherein said third deposition layer comprises silicon nitride deposited by a low pressure chemical vapor deposition method.

18. A method according to claim 15 wherein (b) comprises delivering a first deposition gas comprising the nitrogen-containing gas, the first deposition gas being substantially absent silicon-containing gas, and wherein (d) comprises delivering a second deposition gas comprising the silicon-containing gas, the second deposition gas being substantially absent nitrogen-containing gas.

* * * * *